(12) United States Patent
Casati et al.

(10) Patent No.: US 6,473,310 B1
(45) Date of Patent: Oct. 29, 2002

(54) INSULATED POWER MULTICHIP PACKAGE

(75) Inventors: Paolo Casati, Sesto S. Giovanni; Carlo Cognetti, Milan, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/507,558

(22) Filed: Feb. 18, 2000

(51) Int. Cl.[7] .................................................. H05K 7/10
(52) U.S. Cl. ................ 361/760; 361/761; 361/717-718; 361/704; 361/707; 361/751; 361/768; 438/121; 438/122; 174/52.2; 174/52.4; 174/252; 174/254; 257/684
(58) Field of Search ................................. 361/760, 761, 361/764, 717–718, 704, 707, 722–727, 720, 820, 783, 768, 749–751; 257/684, 701; 438/15, 121–122; 174/252, 254; 264/272.17

(56) References Cited

U.S. PATENT DOCUMENTS

| | | | | |
|---|---|---|---|---|
| 4,561,011 A | * | 12/1985 | Kohara et al. | 356/81 |
| 5,297,006 A | * | 3/1994 | Mizukoshi | 361/704 |
| 5,317,194 A | * | 5/1994 | Sako | 257/777 |
| 5,471,366 A | * | 11/1995 | Ozawa | 361/704 |
| 5,780,926 A | * | 7/1998 | Seo | 257/676 |
| 6,049,074 A | * | 4/2000 | Endo et al. | 250/208.1 |

* cited by examiner

Primary Examiner—David Martin
Assistant Examiner—Thanh Y. Tran
(74) Attorney, Agent, or Firm—Lisa K. Jorgenson; Robert Iannucci; Seed IP Law Group PLLC

(57) ABSTRACT

The invention includes a multichip integrated circuit package having at least two chips electrically isolated from one another. Within the multichip integrated circuit package is a slug that is directly coupled to at least two chips, without any intervening insulating layers. The slug is physically separated at an appropriate place between the two chips, so that electrical interference between the two chips is effectively eliminated. Making the integrated circuit package begins with directly attaching the two chips to a heat dissipating slug. The heat dissipating slug can have a pre-cut groove running between the chips. Once the chips are attached to the slug, the slug is molded into the multichip integrated circuit package. Then, the slug is physically separated into two pieces from the underside, the separation running along the pre-cut groove. Usually the slug would be separated by being cut by a saw.

17 Claims, 3 Drawing Sheets

INSULATED POWER MULTICHIP PACKAGE

TECHNICAL FIELD

This invention relates to power semiconductor device packages, and more specifically, to a method of insulating power semiconductor chips from one another in a package by physically separating them within a single multichip package, and the resultant multichip package.

BACKGROUND OF THE INVENTION

Oftentimes more than one silicon wafer, or "chip" is present in an integrated circuit package. For instance, one integrated circuit package may contain a signal processing chip, a function control chip, and an amplifying chip all within the same integrated circuit package. This is especially true as the miniaturization of electronic devices continues, requiring one-package solutions where previously multi-package solutions were acceptable.

Shown in FIG. 1a is a representation of a twenty pin Dual In-Line Package (DIP). Shown is an integrated circuit (IC) package 10, having twenty pins labeled 12, ten pins on each side of the IC package 10. FIG. 1b shows the IC package 10 without a top cover, giving a view of how the pins 12 are connected within the IC package. The IC package 10 contains a chip 20 that has several bonding pads 14. Each bonding pad 14 is connected to one of the pins 12 of the IC package 10 in a conventional manner, such as by thermosonic or ultrasonic bonding. The chip 20 is coupled to eight of the twenty pins 12 of the IC package 10. The other twelve pins 12 of the IC package 10 are coupled to the bonding pads 14 of a chip 30.

The chips 20 and 30 are attached to a common slug 40, shown in FIG. 2. Often the common slug 40 is made from a metal material such as copper, but any suitable material can be used. When the common slug 40 is made from copper, the chips 20 and 30 can be directly soldered to, or otherwise physically attached to the slug, such as by eutectic bonding. The common slug 40 provides a stable base for handling during the creation of the IC package 10. Additionally, the slug acts as a large heat dissipater, removing heat from the chips 20 and 30 developed during their operation.

However, sometimes the regular operation of the individual chips 20 and 30 causes them to interfere with one another during operation. If, for example, the chip 20 produces an electrical signal that interferes with the operation of the chip 30, the common slug 40 carries that electrical signal directly to the chip 30, causing the interference. To prevent such interference, an electrical insulating layer 50 (FIG. 2) is provided between the chip 30 and the common slug 40. This electrical insulating layer can be an adhesive tape, for example, or a layer of molding compound.

The presence of this electrical insulating layer 50 degrades the efficient heat transfer between the chip 30 and the common slug 40. Therefore, the chip 30, when electrically insulated from the common slug 40 by the electrical insulating layer 50, runs at a higher temperature than if it were directly soldered to the common slug 40. This higher temperature can degrade the performance of the chip 30, or even cause it to malfunction. However, in instances where the electrical insulating layer 50 is necessary, the chip cannot be soldered directly to the common slug 40 otherwise the electrical interference between the chip 20 and chip 30 would be present.

SUMMARY OF THE INVENTION

One embodiment of the invention presents a multichip integrated circuit package having at least two chips electrically isolated from one another. Within the multichip integrated circuit package is a slug that is directly coupled to at least two chips, without any intervening insulating layers. The slug is physically separated at an appropriate place between the two chips, so that electrical interference between the two chips is eliminated.

Another embodiment of the invention presents a method for creating a multichip integrated circuit package having at least two chips electrically isolated from one another. The method begins with directly attaching the two chips to a heat dissipating slug, preferably by soldering the chips to the slug. In one embodiment, the heat dissipating slug has a pre-cut groove running between the chips. Once the chips are attached to the slug, the slug is molded into the multichip integrated circuit package. Then, the slug is physically separated into two pieces from the underside, the separation running along the pre-cut groove. In one embodiment, the slug is cut with a saw.

BRIEF DESCRIPTION OF THE DRAWINGS

FIG. 2 is a cross-sectional view of the twenty pin DIP of FIG. 1a.

DETAILED DESCRIPTION OF THE INVENTION

In this description, discussion of steps or architectures well known to those skilled in the art has been abbreviated or eliminated for brevity. Although this description describes particular embodiments of the invention shown in the figures, the invention is not limited only to those embodiments discussed, as many variations are possible with the precepts outlined herein.

Figure 1A:
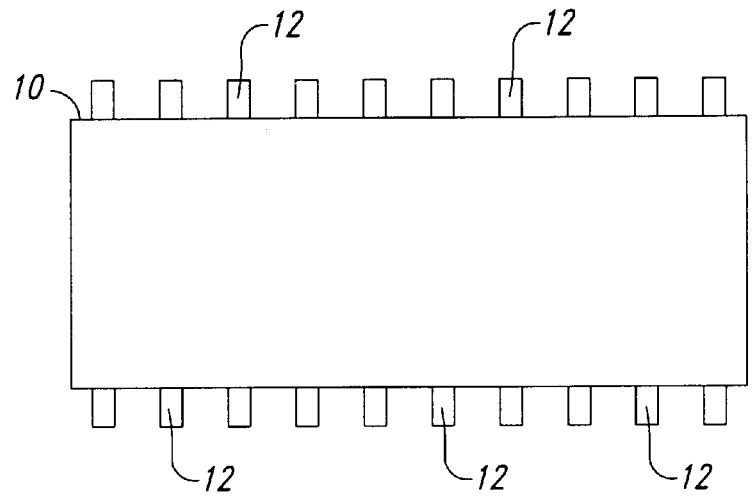
FIG. 1a is a top view of a twenty pin DIP according to the Prior Art.
Figure 1B:
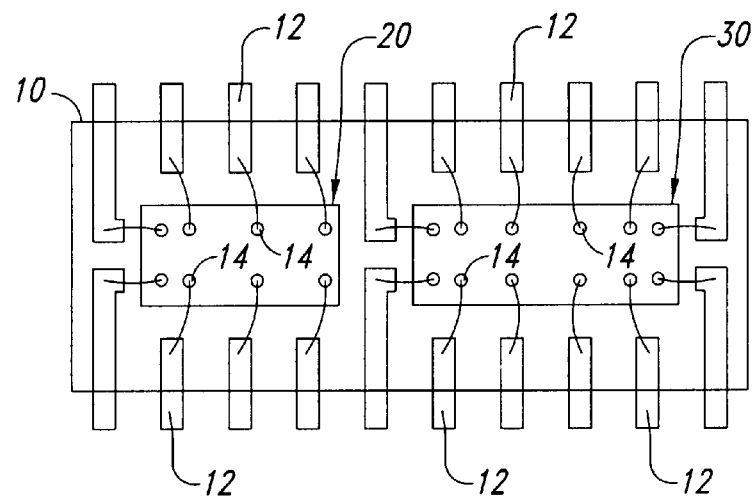
FIG. 1b is a top view of the twenty pin DIP of FIG. 1a, showing the connections of the pins, also according to the Prior Art.
Figure 2:
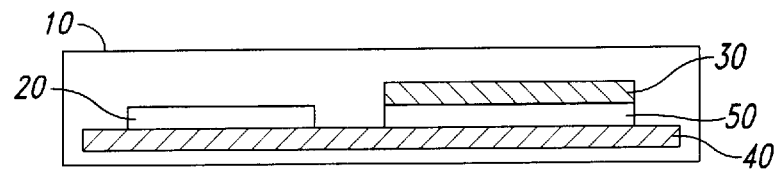
Figure 3:
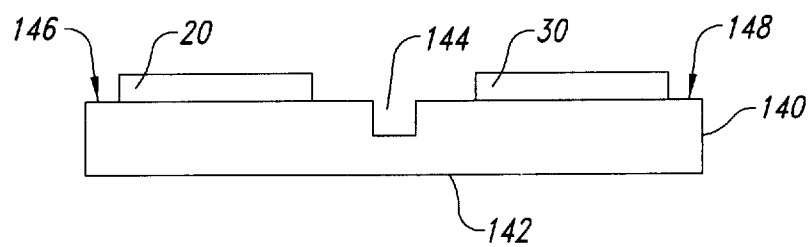
FIG. 3 is a cross-sectional diagram of a slug according to an embodiment of the invention.

FIG. 3 shows a slug 140 used in an embodiment of the invention. The slug 140 is made from copper (although other electrically conductive materials can be used) and is roughly the same size of the IC package that will be ultimately produced. The slug includes a bottom surface 142.

In this embodiment, a groove 144 runs from one side of the slug 140 to an opposite side, effectively creating two die pads 146 and 148 in the slug. Because the slug 140 is still one large piece, it can be moved as a unit and provides a solid base for easy process handling. By including the groove 144 in the slug 140, two die pads 146 and 148 are delineated to indicate where semiconductor chips will be mounted.

Shown in FIG. 3, mounted on the die pad 146 is the chip 20, and mounted on the die pad 148 is the chip 30. In this embodiment, both chips 20 and 30 are power integrated circuits that generate large amounts of heat that is dissipated by the slug 140. The chips 20 and 30 can be attached to the slug 140 in any conventional means. In the preferred embodiment, the chips 20 and 30 are soldered directly to the slug 140, allowing the slug 140 to sink as much heat as possible from the chips 20 and 30 during operation. Another attachment method yielding good heat transfer from the chips 20, 30 to the slug 140 is eutectic bonding.

After the chips 20 and 30 are attached to the slug 140, a molded body 150 is formed around the slug in a conventional manner. The molded body 150 is made from any suitable material, such as ceramic, metal, epoxy resins, or insulating polymide. The molded body 150 completely encloses the chips 20, 30, and slug 140 except for the bottom surface 142 of the slug 140.

Figure 4:
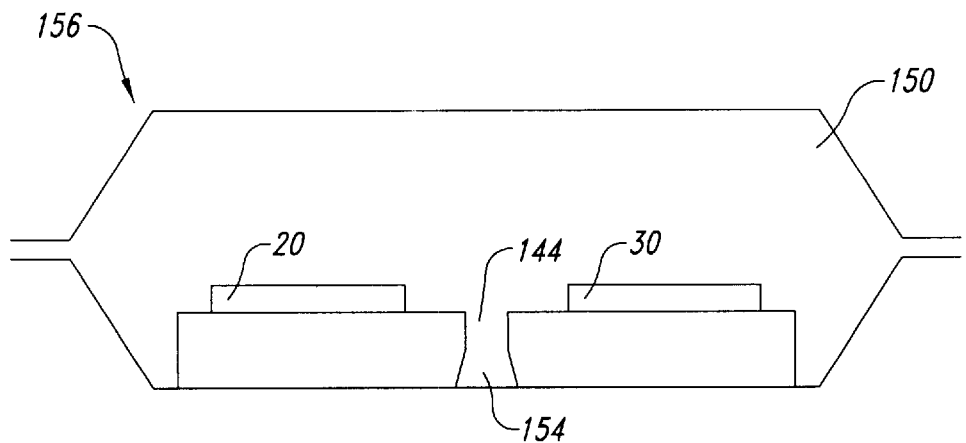
FIG. 4 is a cross-sectional diagram of an IC package that includes the slug of FIG. 3.

Once the molded body 150 is formed around the slug 140, the die pads 146 and 148 of the slug are physically separated, such as by being sawed along the groove 144, producing a saw cut 154 (FIG. 4). The saw cut 154 is most easily made from the bottom surface 142 of the slug 140, which is opposite to the groove 144 itself. While the saw cut 154 must be made in the general area of the groove 144, sawing the slug 140 is not an alignment-critical step, so long as the slug is ultimately separated between the chips 20 and 30. Other methods to physically separate the slug 140 along the groove are acceptable and fall within the scope of the invention.

Cutting the slug 140 along the groove 144 separates the electrical connection that previously existed between the chip 20 and the chip 30, thus preventing electrical signals generated by one of the chips from interfering with the other. The groove 144 was filled with the material used to make the molded body 150 when the molded body was made. The saw cut 154 can also be filled with the same material after the saw cut is made, or it can be filled with another insulating material. The saw cut 154 can even be left as open space within the molded body 150. Once the saw cut 154 has been made, the slug 140 is separated into two pieces and the two resultant pieces are electrically separated from one another by the dielectric materials (e.g., air) in the groove 144 and the saw cut 154.

FIG. 4 shows that an IC package 156 results from this embodiment of the invention and includes both chips 20 and 30 soldered directly to the slug 140, thus maximizing the heat sinking capacity of the slug. Because neither of the chips 20 nor 30 has an intermediary layer of tape, adhesive, or molding compound between it and the slug 140, the heat transfer from the chips to the slug is as high as possible. Additionally, using the same process to bind the chips 20 and 30 to the slug 140 prevents the addition of extra materials and steps into the production process. For instance, using molding compound to attach the chip 30 while the chip 20 is soldered to the slug 140 causes several additional steps that are unnecessary if both chips are soldered to the slug. Also, using a single slug 140 allows the manufacturer to use simple leadframe structures rather than the complicated leadframes associated with a multipad slug design. Using simple leadframes makes the handling process easier for the manufacturer.

The saw cut 154 combined with the groove 144 completely electrically insulates the chips 20 and 30 from one another, yet the direct connection of the chips to the slug 140 maintains the highest rate of heat transfer. The lost heat sink capacity of the slug 140 due to forming the groove 144 and the saw cut 154 is negligible.

Figure 5:
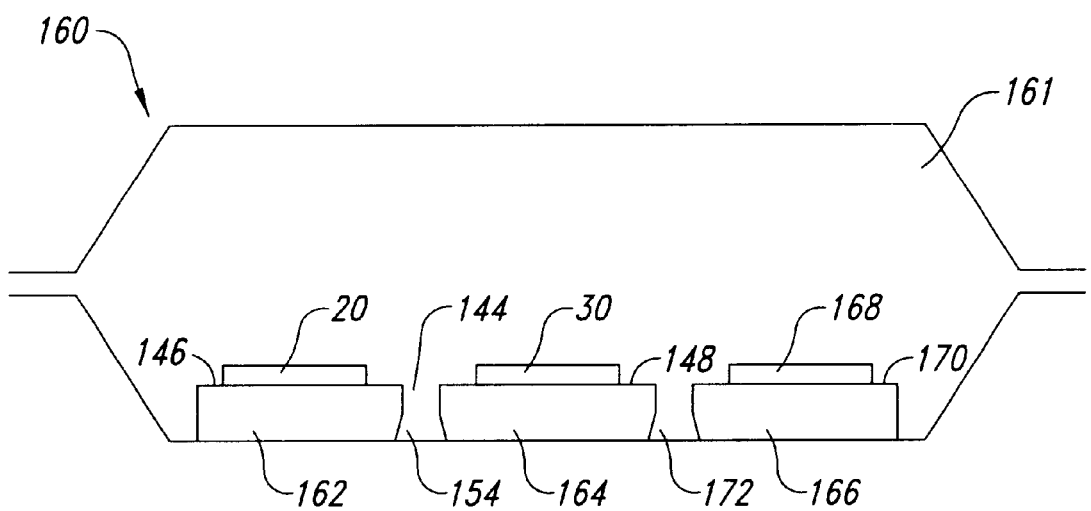
FIG. 5 is a cross-sectional diagram of an alternate IC package.

Although the IC package 156 shown in FIG. 4 is a DIP package, nothing limits this process to only DIP packages. This process can be used for DIP packages, flat-packs, Pin Grid Arrays, quad packs, and the like. Also, the embodiment shown in FIG. 4 only shows one saw cut 154 made in the slug 140, but as many saw cuts 154 as are necessary to electrically separate any number of chips mounted one the slug is specifically contemplated. For example, FIG. 5 shows an IC package 160 with a molded body 161 in which the slug 140 is separated into first, second, and third slugs 162, 164, and 166 onto which are directly affixed the chips 20, 30, and a chip 168, respectively. The third slug 166 has a third die pad area 170 to which the third chip is affixed and is separated from the second slug 164 by a groove 172 into which dielectric material extends.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. An integrated electronic package, comprising:

first and second semiconductor circuit chips;

a conductive slug having a first die pad area directly contacting and coupled to the first semiconductor circuit chip, a second die pad area directly contacting and coupled to the second semiconductor circuit chip, and a recess extending partially through the conductive slug in a region between the first and second die pad areas; and a dielectric material positioned in the recess and separating the first and second die pad areas from each other.

2. The integrated electronic package of claim 1 wherein the slug is made of copper.

3. The integrated electronic package of claim 1, further comprising:

a molded body surrounding the slug and the first and second semiconductor circuit chips.

4. The integrated electronic package of claim 3 wherein the molded body comprises the dielectric material separating the first die pad area and the second die pad area.

5. The integrated circuit of claim 1 wherein the first semiconductor circuit chip is a power semiconductor.

6. The integrated circuit of claim 1 wherein the first semiconductor circuit chip is soldered to the first die pad area.

7. A method of making an integrated semiconductor package, comprising:

mounting a first semiconductor chip to a first die portion of a conductive slug;

mounting a second semiconductor chip to a second die portion of the slug;

forming the slug in the integrated semiconductor package; and separating the first die portion of the slug from the second die portion of the slug after mounting the first and second semiconductor chips to the first and second die portions, respectively, to prevent electrical conduction between the first and second die portions.

8. The method of claim 7 wherein separating the first die portion of the slug from the second die portion of the slug comprises cutting through the slug with a saw.

9. The method of claim 8 wherein the slug includes a groove lying between the first die portion and the second die portion, and wherein cutting through the slug with a saw comprises cutting the slug where the groove lies.

10. The method of claim 8 wherein the slug includes a groove lying between the first die portion and the second die portion, and wherein cutting through the slug with a saw comprises cutting the slug from a side opposite a side of the slug that contains the groove until the groove is reached.

11. The method of claim 8, further comprising:
  after cutting through the slug with a saw, filling a cut left by the saw with a dielectric material.

12. The method of claim 7 wherein mounting a first semiconductor chip to a first die portion of a slug comprises soldering the first semiconductor chip to the first die portion.

13. The method of claim 7 wherein mounting a first semiconductor chip to a first die portion of a slug comprises mounting a power semiconductor chip to the first die portion of the slug.

14. The method of claim 7 wherein mounting a first semiconductor chip to a first die portion of a slug comprises mounting the first semiconductor chip to the first die portion of a copper slug.

15. The method of claim 7 wherein forming the slug in the integrated semiconductor package comprises molding the integrated package around the plug.

16. The method of claim 7 wherein separating the first die portion of the slug from the second die portion of the slug occurs after forming the slug in the integrated semiconductor package.

17. The method of claim 7 wherein separating the first die portion of the slug from the second die portion includes separating the slug into first and second slugs after mounting the first and second semiconductor chips on the first and second die portions, respectively, the first slug including the first die portion and the second slug including the second die portion.

* * * * *

UNITED STATES PATENT AND TRADEMARK OFFICE
CERTIFICATE OF CORRECTION

PATENT NO. : 6,473,310 B1
DATED : October 29, 2002
INVENTOR(S) : Paolo Casati et al.

It is certified that error appears in the above-identified patent and that said Letters Patent is hereby corrected as shown below:

<u>Column 4,</u>
Line 25, after the word "areas", should read -- , the recess is defined by a bottom surface that extends between the first die pad area and the second die pad area which are portions of the slug, wherein the recess comprising a saw cut on each sidewall of the slug; -- in the issued patent.

Signed and Sealed this

Twenty-ninth Day of April, 2003

JAMES E. ROGAN
*Director of the United States Patent and Trademark Office*